United States Patent [19]

Hayashi et al.

[11] 4,015,283
[45] Mar. 29, 1977

[54] HIGH SPEED ELEMENT OF AN INTEGRATED CIRCUIT WITH A MAJORITY CARRIER JUNCTION HAVING A LARGE CURRENT CAPABILITY

[75] Inventors: Yutaka Hayashi, Hoya; Yasuo Tarui, Tokyo, both of Japan

[73] Assignee: Kogyo Gijutsuin, Tokyo, Japan

[22] Filed: July 25, 1975

[21] Appl. No.: 599,083

Related U.S. Application Data

[63] Continuation of Ser. No. 125,789, March 18, 1971, abandoned, which is a continuation-in-part of Ser. No. 809,654, March 24, 1969, abandoned.

[30] Foreign Application Priority Data

Mar. 25, 1968 Japan .............................. 43-18984
Apr. 21, 1968 Japan .............................. 43-12973

[52] U.S. Cl. .................................................. 357/15
[51] Int. Cl.² .......................................... H01L 29/48
[58] Field of Search ....................................... 357/15

[56] References Cited

UNITED STATES PATENTS 3,463,975  8/1969  Biard ................................. 317/235
3,909,837  9/1975  Kronlage ............................ 357/15

*Primary Examiner*—Martin H. Edlow
*Attorney, Agent, or Firm*—Holman & Stern

[57] ABSTRACT

In an element of an integrated circuit including a transistor and a "majority carrier diode" at least one terminal of which is connected to the base or collector of said transistor, the "majority carrier diode" is laid out in a transistor portion of the integrated circuit to be surrounded by a part of base region extended to the surface of the semiconductor body, so that the paths for the load current of the transistor and the diode current are separated from each other, whereby a high speed operation at a heavy load current is made possible and/or so that reliability of said majority carrier diode is increased.

6 Claims, 4 Drawing Figures

1

HIGH SPEED ELEMENT OF AN INTEGRATED CIRCUIT WITH A MAJORITY CARRIER JUNCTION HAVING A LARGE CURRENT CAPABILITY

This is a continuation of application Ser. No. 125,789 filed Mar. 18, 1971, now abandoned, which in turn is a Continuation-in-part of application Ser. No. 809,654 filed Mar. 24, 1969, now abandoned.

BACKGROUND OF THE INVENTION

This application is a continuation-in-part of application Ser. No. 809,654 filed Mar. 24, 1969. This invention relates generally to the field of high-speed electronic circuits wherein a "majority carrier diode" is employed as a circuit component thereof, and the high-speed operational characteristic of the circuits is thereby substantially improved.

Heretofore, the Schottky barrier diode was known and constituted one version of the "majority carrier diode," wherein a metal semiconductor junction is used instead of the conventional PN or NP junction, and the current is carried by the majority carriers instead of the minority carriers as was the case in the conventional junction.

It has been previously proposed that in an integrated circuit including a transistor, the saturation period of the transistor is shortened or the saturation phenomena thereof is utterly eliminated by connecting the "majority carrier diode" between some of the electrodes of the transistor or between an electrode thereof and the ground potential.

We made a Schottky barrier diode of a size comparable to the transistor (approximately 10 microns square) utilizing molybdenum, and found that when the diode current is 3 mA, the voltage drop across the diode was about 0.35 V. This voltage drop was almost constant (actually increased about 26 mV) even when the diode current was doubled.

On the other hand, in a high-speed integrated circuit of faster than 10 ns, a high quality transistor having a width of the emitter of 10 microns, length of the emitter of several tens of microns square is used for the output transistor, and, in this case, the collector series resistance is about 20 ohms.

It should be noted that in the ordinary integrated circuit of standard nature, the saturation of the transistor becomes significant when the real base voltage, excluding the effect of the parasitic resistances, exceeds approximately 0.5 V (this value is somewhat different depending on the manufacture).

As illustrated in FIG. 1 of the accompanying drawings, which will be described hereinafter, when the Schottky barrier diode is connected into an integrated circuit comprising: a transistor Q, a parasitic resistor $\gamma c$, an input terminal $t_{in}$, and an output terminal $t_o$, and when an input current $I_{in} = 3$mA and a load current $I_L = 10$mA are caused to flow through the circuit, a voltage drop of 0.26 V or more is created across the series resistor $\gamma c$. As a result, the voltage across the base collector junction becomes more than 0.61 V at the "ON" condition of the transistor, and the transistor Q shows a severe saturation.

The reason for this is in the fact that the load current flows through the same path as the diode current, and if the paths for these two currents are substantially separated, the operation of the Schottky barrier diode (hereinafter abbreviated as SBD) is effectuated and far larger current can be passed through the load.

SUMMARY OF THE INVENTION

An object of the present invention is to provide a novel pattern layout of an integrated switching circuit including a "majority carrier diode" whereby the switching current capacity and device reliability are significantly increased.

The nature, principle, and details of the present invention will become fully apparent from a consideration of the following detailed description of various embodiments thereof, when read in conjunction with the accompanying drawings.

DETAILED DESCRIPTION OF THE INVENTION

Figure 1:
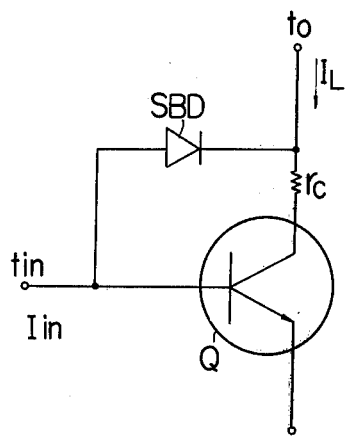
FIG. 1 is an example of a conventional high-speed circuit including a "majority carrier diode"
Figure 2:
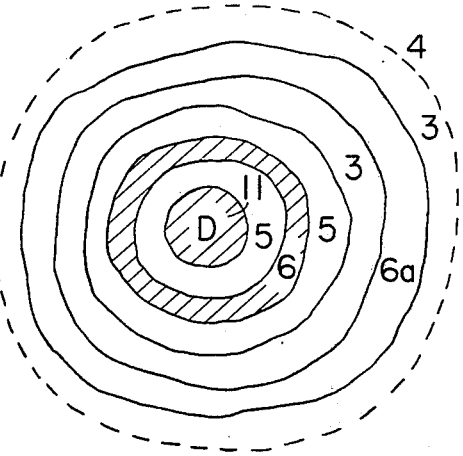
FIG. 2 is a plan view of an embodiment of this invention.
Figure 3:
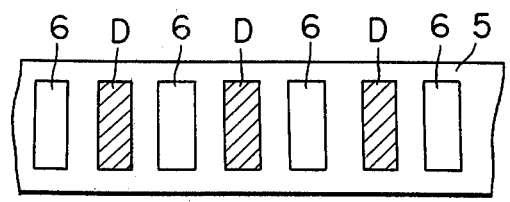
FIG. 3 is a plan view showing another embodiment of this invention, wherein the invention is applied to a high speed heaving current element.

To maximize the effect of clamping by a majority carrier diode, it is one of the best solutions that said majority carrier junction is so laid out as to be surrounded by the base region as shown in FIG. 2 and 3 whereby the minimum part of the load current $I_L$ passing through the collector contact of a transistor at the "outside" of the base region participates in minimum length of current path with the current passing through said majority carrier junction. In other words, in the above-mentioned arrangement, the part of the collector resistance harmful to the effective clamping of the majority carrier diode is minimized. The majority carrier junction described above is the junction of the majority carrier diode and, in the case of the diode connection shown in FIG. 1, is formed on the surface of the collector region at the "inside" of the base region. Part of the material by which the majority carrier junction is formed on the surface of the collector region at the "inside" of the base region may contact the surface of the base region, in that case, one terminal of the majority carrier diode may be connected directly to the base.

FIG. 2 illustrates a plan view of main regions of an embodiment of this invention, wherein the component elements are arranged in a "ring base construction" and the load current and the diode current are almost separated. In this example, a transistor comprising collector regions 3, a region for the collector contact 6a base regions 5 and an emitter region 6, said region 3 being isolated by the isolation regions 4 from the other elements in an integrated circuit. The majority carrier junction D is surrounded by the base region 5. In this FIGURE, the contact holes and wiring metal are not shown for the simplification of the concept. The material 11 by which the majority carrier junction is formed is attached onto the surface of the region marked D where was a surface of a part of the collector region before attachment of said carrier junction. The material 11 may contact on the surface of the base region 5 depending on the application. In this case material 11 can be used both as the base lead and diode lead. The base layer 5 and the emitter layer 6 may have a configuration which is not completely closed, such as a C-shaped configuration, and the above-described object can be attained without any harmful effect.

Figure 2A:
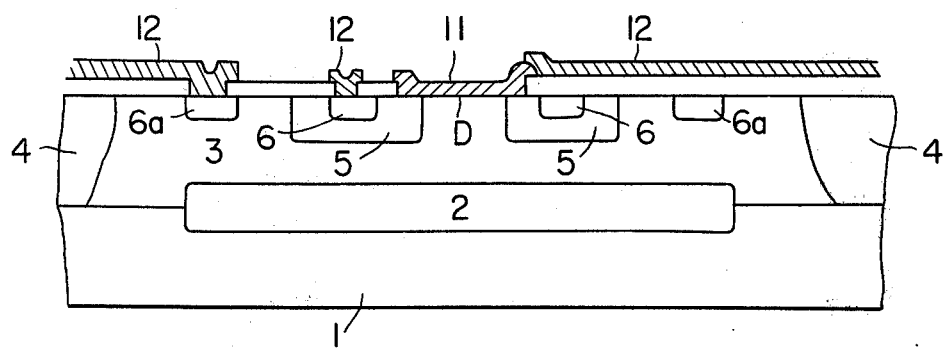
FIG. 2A is a sectional view of the embodiment shown in FIG. 2.

So as to facilitate understanding of the embodiment of FIG. 2, attention is now directed to FIG. 2A depicting a sectional view thereof. The substrate is indicated by reference numeral 1, 2 is a buried layer, 12 is a metal layer for contacting and wiring, and member 11 and 12 may be made of the same substance. FIG. 2A particularly relates to a sectional view of that portion of FIG. 2 where base and collector are led out in the case in which base is directly connected with one terminal of the majority carrier diode.

FIG. 3 illustrates another embodiment of this invention wherein a number of emitter layers 6 are provided for obtaining a high-frequency high current element. In this case, a plurality of barriers of the SBD are formed in the base layer 5 or in the N-type epitaxial layer so that the barriers are interposed alternately between the plurality of emitter layers 6.

As has been described above with reference to FIGS. 2 and 3, the integrated circuit according to this invention can afford a larger current capacity than conventional circuits made of equivalent components, and, furthermore, the majority carrier junction is protected by the base region surrounding said junction, thus resulting high reliability of the majority carrier diode without the edge leakage.

ACCORDINGLY,

What is claimed:

1. An element of an integrated circuit comprising a semiconductor body having emitter, base and collector regions of a transistor with collector-base and base-emitter P-N junctions and a majority carrier junction formed on one surface of said body, said one surface further having an insulating layer thereon; said collector region comprising first and second spacedapart surface portions, said first surface portion being disposed laterally to one side of said base region at said one surface of said body and said second surface portion being continuous with said first portion in said body and disposed laterally to the opposite side of said base region at said one surface of said body, said base region separating said collector region into said first surface portion and said second surface portion at said one surface of said body, said base region being surrounded by said collector region in said body; said majority carrier junction being formed through an opening in said insulating layer by an electrode on said first surface portion of said collector region, an electrode ohmically contacting said base region through an opening in said insulating layer, a collector electrode being formed on said second surface portion of said collector region, an electrical conductor means providing electrical connections to said majority junction, base, collector and emitter electrodes and further effecting a continuous connection of said majority carrier junction electrode and said base electrode, whereby load current capability is improved without increasing storage time of said transistor.

2. An element according to claim 1, wherein said emitter, base, and collector regions are substantially annular in configuration, and wherein said first surface portion of said collector region is surrounded by said base region at said one surface of said body and said second surface portion is disposed laterally to the outside of said base region at said one surface of said body.

3. An element according to claim 1, wherein said electrical conductor means are disposed on said insulating layer.

4. An element as defined in claim 2, wherein said electrical conductor means are disposed in said insulating layer.

5. An element according to claim 4, wherein said transistor has a plurality of emitter regions in said base region and a plurality of majority carrier junctions; each said majority carrier junction being formed on a corresponding first portion of said collection region which is surrounded by the base region on the surface of the element, said majority carrier junction being located between separate emitter regions.

6. An integrated circuit containing at least one element according to claim 1.

* * * * *